United States Patent [19]

Ebihara

[11] 4,255,723

[45] Mar. 10, 1981

[54] AMPLITUDE CONTROL INVERTER CIRCUIT FOR ELECTRONIC DEVICE

[75] Inventor: Heihachiro Ebihara, Tokorozawa, Japan

[73] Assignee: Citizen Watch Co. Ltd., Tokyo, Japan

[21] Appl. No.: 908,305

[22] Filed: May 22, 1978

[30] Foreign Application Priority Data

May 26, 1977 [JP] Japan .................................. 52/61666

[51] Int. Cl.³ .............................................. H03B 5/36
[52] U.S. Cl. ............................ 331/116 FE; 330/264; 307/452
[58] Field of Search ....................... 307/205, 214, 304; 330/277, 264; 331/116 FE; 58/23 R, 23 A, 23 BA, 23 AC

[56] References Cited

U.S. PATENT DOCUMENTS

| | | | |
|---|---|---|---|
| 3,855,549 | 12/1974 | Huener et al. .................... | 307/205 X |
| 3,939,643 | 2/1976 | Nishikubo ............................ | 58/23 A |

*Primary Examiner*—Siegfried H. Grimm
*Attorney, Agent, or Firm*—Jordan and Hamburg

[57] ABSTRACT

An amplitude control inverter circuit for an electronic device having a power source and a signal source. A complementary pair of field effect transistors having gate electrodes are connected to the signal source, and at least one amplitude control field effect transistor is connected to the complementary pair of field effect transistors. The amplitude control field effect transistor has its gate electrode responsive to a phase delayed output of the complementary pair of field effect transistors to control a duration of current flow in the complementary pair of field effect transistors. A resistor is connected to the gate electrode of the amplitude control field effect transistor. A capacitor has one terminal connected to a terminal of the resistor and also to the amplitude control field effect transistor, and another terminal connected to the power source. The amplitude control inverter circuit may be used in crystal oscillators and in buffer amplifiers.

6 Claims, 21 Drawing Figures

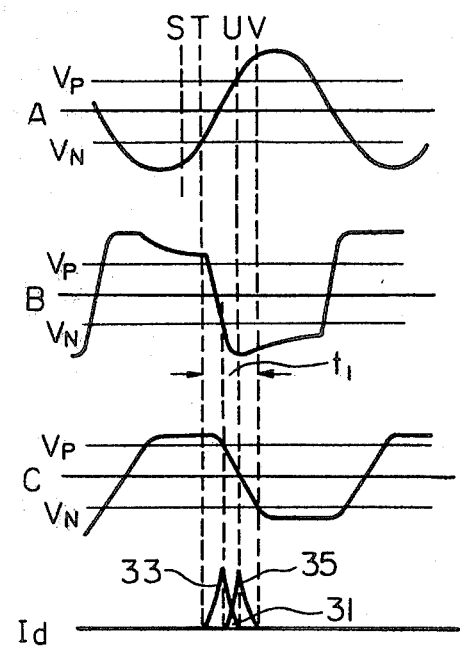

AMPLITUDE CONTROL INVERTER CIRCUIT FOR ELECTRONIC DEVICE

The present invention relates to inverter circuits, and in particular to a method of reducing the power consumption of an oscillator circuit employing insulated gate field effect transistors.

Complementary metal oxide silicon insulated gate field effect transistors (abbreviated herein as CMOS FETs) are widely used at present as logic elements and amplifier elements, in circuit applications where an extremely low level of power consumption is desirable, such as miniaturized electronic devices, electronic wristwatches, etc. A CMOS FET is composed of a P type metal oxide silicon insulated gate field effect transistor (abbreviated herein to P-MOS FET) and an N type metal oxide silicon insulated gate field effect transistor (abbreviated herein as N-MOS FET), the transistors being connected in series with their drain terminals and gate terminals connected together. Such a CMOS FET draws a very low level of current when the signal applied to the gate terminal is either at a high level, so that the applied voltage of the P-MOS transistor exceeds the threshold voltage thereof and that transistor is in the pinched-off condition, or at a low voltage level which is less than the threshold voltage of the N-channel transistor, so that this transistor enters the pinched-off condition. If the transition times between the high and low levels of the input signal are extremely short (i.e. the rise and fall times of the input signal are short), then the average current drawn during input signal level transitions will also be very small. However, as the duration of the transition times is increased, the average current drawn from the power source will also increase. This is because, during the input voltage range in which neither the N-channel transistor nor the P-channel transistor is pinched-off, both transistors will momentarily be in the conducting condition simultaneously. Thus, the greater the time for which the input voltage is within this range, the greater will be the current drawn during transitions between the high and low level of the input signal.

This transition current becomes a problem in the case of the quartz crystal oscillator circuits which are used to provide a standard timing reference signal in electronic wristwatches. Since the piezoelectric voltage generated by the quartz crystal vibrator in such an oscillator is of approximately sinusoidal waveform, the transitions between high and low voltage levels are of relatively long duration. Thus, if a CMOS transistor is used as the amplifying element by which oscillations are sustained, the power consumed by the oscillator circuit will be significantly higher than that of other CMOS circuitry.

One possible method of overcoming this problem is to reduce the conductance of the CMOS transistor used as the amplifying element in the oscillator circuit. If this is done, then the transition current can be reduced. One of methods for reducing the conductance of the CMOS transistor is to increase the threshold voltage of the transistor. However such a method is not always practicable. Other CMOS transistors on the same integrated circuit substrate may be required to have a relatively high conductance, for such purposes as driving a stepping motor, for example. Production of transistors having dissimilar threshold voltages upon the same substrate presents several problems. Another method is to insert resistors, or MOS transistors functioning as resistive elements, in series with the CMOS transistor. If this method is adopted for the amplifying element of the oscillator circuit, then difficulty may be experienced in restarting operation of the oscillator if the operation is temporarily interrupted, i.e. the start-up characteristics of the oscillator will be poor. Also, since the amplitude of the output signal of the oscillator is reduced by this method, the level transition times of this signal when it drives a subsequent buffer circuit or other circuit will be increased, so that the transient current drawn by such a circuit will be increased. If it is attempted in turn to reduce the transient current drawn by such a buffer circuit by the same method, i.e. by inserting resistance in series with the buffer circuit CMOS transistor, then the output of the buffer circuit will have long transition times between voltage levels, so that the problem of increased transient current will then occur in the circuit following the buffer circuit.

With an oscillator circuit in accordance with the present invention, this problem is solved by inserting amplitude control transistors in series with the amplifying CMOS transistor of the oscillator circuit or buffer circuit. These transistors are controlled by the output signal of the circuit which they control, so as to cut off the flow of current through a conducting transistor after an interval which is determined by the amplitude of the input signal. Thus, if the amplitude of the input signal to the amplifying CMOS transistor is too low, so that the signal has relatively long rise and fall times, then the conduction periods of this transistor will be increased by the action of the amplitude control transistors. This allows more time for the output signal to rise to full amplitude. Conversely, if the input signal to the amplifying transistor is too large, then the conduction periods of this transistor will be reduced by the action of the amplitude control transistors. Thus, the time allowed for the output signal to rise (and fall) is decreased, so that the amplitude of the output signal is limited. The amplitude of the output signal is thereby held constant, in spite of variations in the amplitude of the input signal. If the amplifying transistor is part of an oscillator circuit, then the output level of the oscillator is held constant, but the circuit has good start-up properties, and can supply a load consisting of other CMOS transistor gate circuits without waveform deterioration. Control is achieved very simply, by shifting the phase of the signal applied to the gates of the amplitude control MOS transistors relative to the phase of the output signal of the amplifier transistors. Few additional components are required other than the amplitude control transistors, and the resistor/capacitor combination used in the oscillator circuit feedback loop may also be used to perform the necessary phase shift of the amplitude control signal. Another method according to the present invention utilizes a back voltage applied between the gate and substrate of an amplifying transistor to achieve a reduction of the transient current.

It is therefore an object of the present invention to provide an improved oscillator circuit having reduced power consumption.

More particularly, it is an object of the present invention to provide an improved oscillator circuit wherein the durations of periods of conduction of an MOS transistor performing an amplifying function in said oscillator circuit are controlled in accordance with the amplitude of an input signal applied to said MOS transistor, said control being performed by applying an output signal of said oscillator circuit, delayed in phase, to a gate terminal of an MOS transistor performing an amplitude control function.

Other objects, features and advantages of the present invention will be made more apparent by the following description when taken in conjunction with the attached figures, in which:

FIG. 9 is a waveform diagram illustrating the relationship between the voltage applied to the gate of an amplifying CMOS transistor in the circuit of FIG. 8 and the output and control voltages of said circuit;

Figure 1:
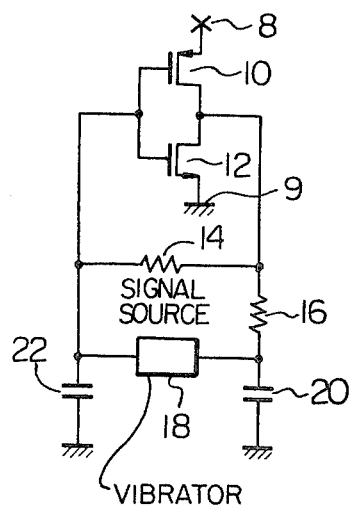
FIG. 1 is a circuit diagram of a quartz crystal oscillator circuit using a CMOS transistor, of conventional design.

FIG. 1 shows the circuit of a quartz crystal oscillator of conventional type, utilizing a CMOS inverter as an amplifying element. The CMOS inverter comprises a P-MOS transistor 10 and an N-MOS transistor 12. The drains of these transients are connected together and to one end of an output resistor 16 and one end of a feedback resistor 14. The gates of the MOS transistors 10 and 12 are connected together and to the other end of feedback resistor 14 and also to one terminal of a quartz crystal vibrator element 18 and one terminal of a capacitor 22. The other terminal of quartz crystal vibrator element 18 is connected to the other end of output resistor 16 and to one terminal of a capacitor 20. The other terminals of capacitors 20 and 22 are grounded. The source terminal of P-channel transistor 10 is connected to the high potential 8 of a power source, while the source terminal of N-MOS transistor 12 is connected to the low potential 9 of the power source, which is the ground potential.

Vibrator element 18 acts as a signal source for transistors 10 and 12, by generating a piezoelectric voltage.

Figure 2:
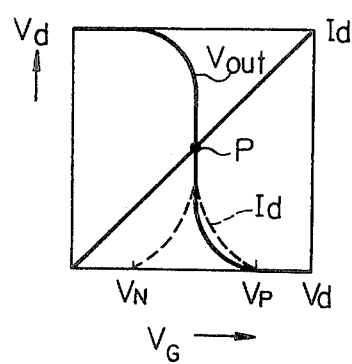
FIG. 2 is a graph illustrating the relation between the gate voltage and drain voltage of a CMOS transistor, and the transient drain current in such a transistor.

The relationship between the voltage applied to the gate terminal of a CMOS inverter such as that shown in the circuit of FIG. 1 is illustrated by the graph of FIG. 2. When the gate voltage is less than the threshold voltage of the N-MOS transistor of the inverter, the output voltage is at the high potential. This is because the P-MOS transistor is in a conducting state while the N-MOS transistor is in the pinched-off state. When the gate voltage starts to exceed the threshold voltage of the N-MOS transistor, then this transistor also begins to enter the conducting state. Thus, the drain current of the inverter, shown as Id by the dotted line curve in FIG. 2, starts to increase. When the gate voltage reaches a level which is midway between Vn (the threshold voltage of the N-MOS transistor) and Vp (the threshold voltage of the P-MOS transistor), the drain current reaches a maximum. As the gate voltage is increased, to approach the threshold voltage Vp of the P-MOS transistor, this transistor starts to approach the pinched-off condition, so that the drain current begins to be reduced. When the gate voltage rises above the threshold voltage Vp of the P-MOS transistor, then the drain current becomes completely cut off, since now only the N-MOS transistor is conducting, while the P-MOS transistor is pinched-off.

Figure 3:
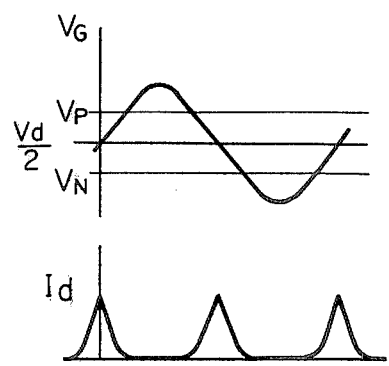
FIG. 3 is a waveform diagram illustrating the relationship between a sinusoidal voltage applied to the gate of a CMOS transistor and the transient drain current flowing in the transistor.

The effect of applying a sinusoidally varying voltage to the gate of a C-MOS inverter is shown in FIG. 3. It is apparent that transient peaks of drain current Id flow each time the input voltage passes through the range between the threshold voltage of the N-MOS transistor and the threshold voltage of the P-MOS transistor. It will also be apparent that the average value of this drain current will increase as the amplitude of the input gate voltage Vg is decreased, since the proportion of time in which the gate voltage is in the range between Vp and Vn will be increased.

Figure 4:
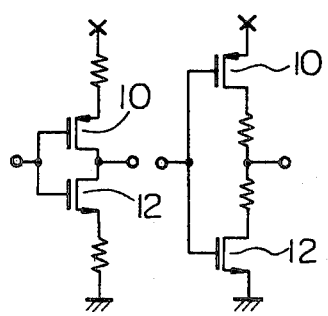
FIG. 4 is a diagram illustrating a method of reducing the magnitude of the transient current flowing in a CMOS transistor, known in the prior art.
Figure 5:
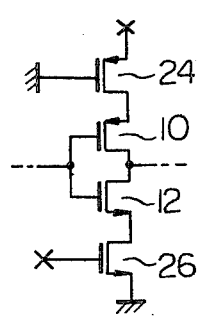
FIG. 5 is a circuit diagram illustrating an alternative, but similar, method to that shown in FIG. 4.
Figure 6:
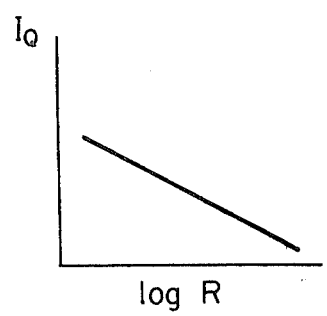
FIG. 6 is a graph illustrating the relation between the average level of transient current for the method shown in FIG. 4 and FIG. 5 and the magnitude of series resistance inserted.
Figure 7:
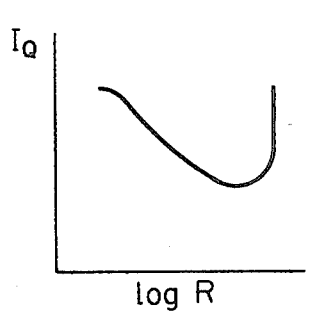
FIG. 7 is a graph illustrating the same relation as the chart of FIG. 6, but in the case of application of the method to an oscillator circuit which drives the gate of another transistor.

In other to reduce the value of drain current without changing the conductance of the MOS transistors in an inverter, resistance can be inserted in series with the drains or the sources of the P-MOS and N-MOS transistors, as shown in FIG. 4. If this method is applied to the oscillator circuit shown in FIG. 1, then the relationship between the value of resistance inserted R and the mean value of the drain current becomes as shown in the graph of FIG. 6. It can be seen that this method appears to be effective in reducing the level of drain current. However, one disadvantage of this method is that, due to the effect of the inserted resistance, the amplitude of the output voltage from the oscillator circuit is reduced. Thus, the level of drain current drawn by the C-MOS inverter will be increased, as explained above with reference to FIG. 3. In addition, the reduced amplitude of the oscillator output signal will cause increased drain current to be drawn by a C-MOS stage which is connected to the output of the oscillator circuit, such as a buffer stage. The relationship between the drain current of a combination of oscillator and C-MOS buffer stage, for the method shown in FIG. 4, is as shown by the graph of FIG. 7. It is apparent that the drain current can only be reduced below a certain point by increasing the resistance inserted, and that after that point the drain current begins to increase, due to the reduced amplitude of the output voltage from the oscillator. The resistors shown in FIG. 4 may be replaced by MOS transistors used as resistance elements, as shown in FIG. 5.

Another method which may be adopted to reduce the level of drain current drawn by the oscillator circuit is to increase the value of the output resistor (resistor 6 shown in FIG. 1). This method presents similar disadvantages to the method just described. In addition, both of these methods of inserting increased resistance have the undesirable effect of causing deterioration of the start-up characteristics of the oscillator. Thus, if oscillation is temporarily interrupted due to some transient disturbance, a relatively long period of time will elapse before the oscillator circuit output voltage again recoverse to its full amplitude.

Figure 8A:
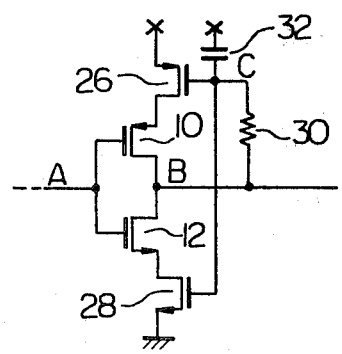
FIG. 8A is a circuit diagram illustrating a first embodiment of the present invention.

A first embodiment of an amplitude control inverter circuit according to the present invention is shown in FIG. 8A, which is a circuit schematic of an inverter circuit for use in a quartz crystal oscillator circuit. P-MOS transistor 10 and N-MOS transistor 12 correspond to the components with the same numerals shown in FIG. 1, and perform the same function as in the circuit of FIG. 1, i.e., amplification of the oscillator signal A. A P-MOS transistor 26, connected to the source terminal of transistor 10, and an N-MOS transistor 28, connected to the source terminal of transistor 12, perform an amplitude control function with respect to the output voltage of the oscillator circuit, as will be described below. A resistor 30 is connected to the drain terminals of transistors 10 and 12, the other end of this resistor being connected to the gate terminals of transistors 26 and 28, and to a capacitor 32. Resistor 30 and capacitor 32 serve to delay the phase of the signal appearing on the gate terminals of transistors 26 and 28 (referred to in the following as signal C) with respect to the phase of the output signal appearing at the drain terminals of transistors 10 and 12 (referred to in the following as signal B). The relationships between the input gate signal A and signals B and C will now be discussed with reference to the waveform diagrams in FIG. 9.

At time point S, indicated by a broken line in the diagram, the input gate voltage is lower than the threshold voltage Vn of N-MOS transistor 12, so that this transistor is in the pinched-off condition and therefore is non-conducting. P-MOS transistor 10 is in the conducting state, but since the output voltage is at the high potential level, the threshold voltage of P-MOS transistor 26 is exceeded by the gate voltage, so that this transistor is in the pinched-off condition. Transistor 28 is in the conducting state. Thus, at this time, no drain current can flow through the MOS transistor chain, since transistors 26 and 12 are in the non-conducting condition. When the input voltage has increased sufficiently to exceed the threshold voltage of N-MOS transistor 12, then this transistor begins to enter the conducting state. Thus, the output load is connected to the low potential of the power source through transistors 12 and 28. Since transistor 26 is still in the pinched-off condition, however, no drain current can flow through transistors 12 and 28 from transistors 10 and 26. The output voltage of the circuit, voltage B, then begins to fall. After a certain time delay, determined by resistor 30 and capacitor 32, voltage C falls below the threshold voltage Vp of P-MOS transistor 26. Current can now flow from the high potential of the power source to the low potential, through transistors 10, 26, 28 and 12, since all of these transistors are in the conducting condition. When the input voltage now rises above the threshold voltage Vp of P-MOS transistor 10, at time U, then this transistor becomes non-conducting, so that current can no longer flow through the transistor chain 26, 10, 12 and 28.

Subsequently, at time V, voltage C falls below the threshold voltage of N-MOS transistor 28, so that this transistor becomes non-conducting. The output load is now disconnected from the low potential of the power source.

From the above description, it will be apparent that a transient drain current can only flow during the time interval between control voltage C falling below the threshold voltage Vp of transistor 26 and the input gate voltage rising asbove the threshold voltage Vp of transistor 10. In other words, drain current can only flow through the transistor chain in the interval in which the conducting states of transistors 26 and 28 and transistors 10 and 12 overlap. This is shown by the lower line in FIG. 9, in which the two peaks represent the transient current which would flow through transistor pair 10 and 12 (numeral 33) and transistor pair 26 and 28 (numeral 35) respectively, if the path of drain current flow were not blocked. The small peak (numeral 31) indicates the transient drain current which actually does flow. It is apparent that this is much smaller than would be the case if amplitude control transistors 26 and 28 were omitted. It is thus apparent that this embodiment of the present invention can provide a substantial reduction in the transient drain current drawn by the oscillator circuit shown in FIG. 1.

Figure 10:
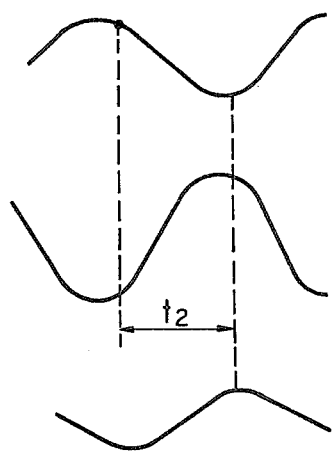
FIG. 10 is a waveform diagram illustrating the same relationships as those of FIG. 9, but for the case of an excessively low input voltage being applied to the circuit.

The amplitude control properties of this embodiment of the present invention will now be described, with reference to FIGS. 9, 10 and 11. Referring again to FIG. 9, it can be seen that the load at the output of the circuit is connected to the low potential of the power source (i.e. the load is driven from the power source) only during time interval $t_1$, which extends from the input signal rising above the threshold potential Vn (time point T) until the level of control voltage C falls below the threshold potential Vn (time point V). If, as shown in FIG. 10, the amplitude of the input gate signal A should be reduced, then this will result in an increase in the delay of control voltage C and so an increase in the time for which the load is driven from the power source, to $t_2$. As a result, the amplitude of the output voltage is increased, thereby compensating for the fall in the amplitude of the input voltage.

Figure 11:
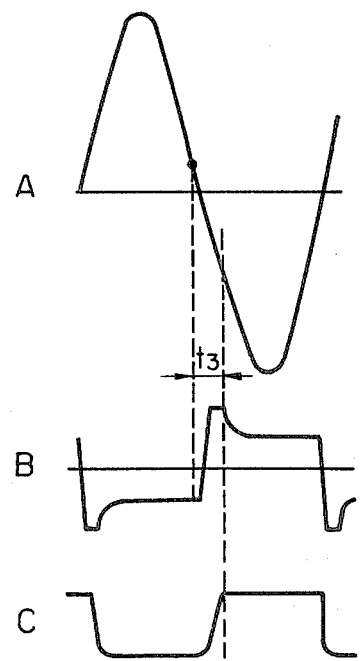
FIG. 11 is a waveform diagram illustrating the same relationships as those of FIG. 9, but for the case of an excessively high input voltage being applied to the circuit.

If, as shown in FIG. 11, the amplitude of the input voltage to the gates of the inverter should increase, then since the output voltage transitions will take place more rapidly, the delay of control voltage C will be effectively reduced, so that the time for which the load is driven from the power source will be reduced to $t_3$. As a result, the amplitude of the output voltage is decreased, thereby compensating for the rise in the amplitude of the input voltage.

Due to the signal voltage amplitude compensation characteristics of this embodiment of the present invention, an oscillator circuit incorporating such an inverter stage has extremely good start-up characteristics, a high level of output signal amplitude stability, and very low power consumption.

Figure 8B:
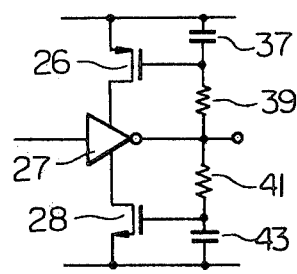
FIG. 8B is a circuit diagram showing an alternative arrangement of the first embodiment of the present invention.

FIG. 8B shows an alternative arrangement of the first embodiment of the present invention. With this arrangement, separate phase delay circuits, comprising resistor 39 and capacitor 37, and resistor 41 and capacitor 43, are connected to the gates of amplitude control MOS transistors 26 and 28 respectively. Numeral 27 indicates the amplifying CMOS transistor, comprising transistors 10 and 12 connected as shown in FIG. 8A above. It will be apparent that the functioning of this arrangement of the first embodiment is identical to that of the arrangement shown in FIG. 8A.

Figure 8C:
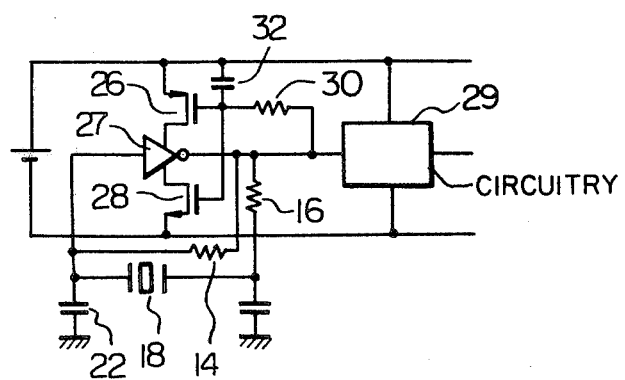
FIG. 8C is an example of a circuit diagram of an oscillator circuit which incorporates the first embodiment of the first invention.

FIG. 8C shows the circuit diagram of an oscillator circuit which incorporates the first embodiment of the present invention. Here, numeral 27 indicates the amplifying CMOS inverter, comprising transistors 10 and 12 connected as shown in FIG. 8 above. The piezoelectric voltage generated by vibrator element 18 serves as the input signal to CMOS inverter 27 in this case. Such an oscillator circuit has extremely good start-up characteristics, and excellent amplitude stability. It can thus be used to directly drive other circuitry, indicated by numeral 29, without an intermediate buffer stage being required.

Figure 12:
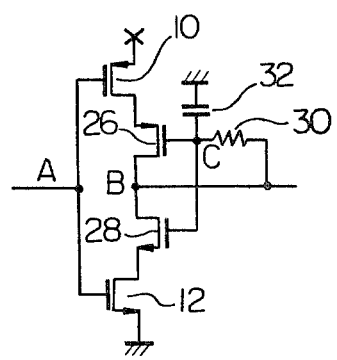
FIG. 12 is a circuit diagram illustrating a second embodiment of the present invention, which is basically identical to the first embodiment.

A second embodiment of the present invention is shown in FIG. 12. In this case, amplitude control MOS transistors 26 and 28 are connected in series with the drain terminals of amplifying transistors 10 and 12. The operation of this circuit is essentially identical to that of the first embodiment of the present invention described above.

Figure 13:
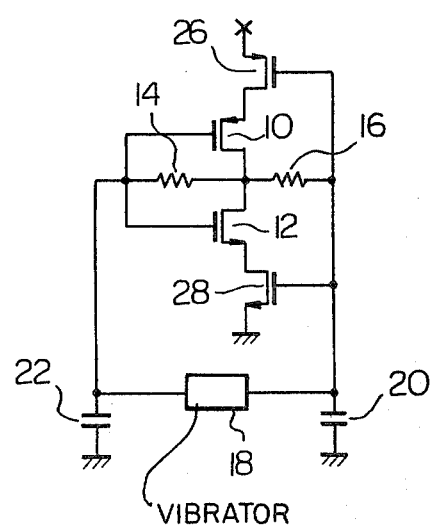
FIG. 13 is a circuit diagram illustrating a third embodiment of the present invention.

A third embodiment of the present invention is shown in FIG. 13. In this case, the values of output resistor 16 and capacitor 20 are selected such that these components can perform phase shift functions for both the oscillator feedback loop and also for the amplitude control signal. Otherwise, the operation of this embodiment of the present invention is essentially identical to that of the first embodiment described above.

Figure 14:
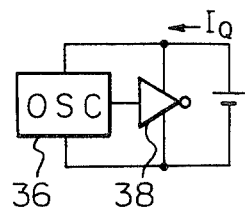
FIG. 14 is a simplified circuit diagram of an oscillator circuit driving a buffer amplifier.
Figure 15:
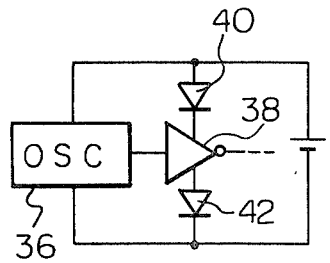
FIG. 15 is a simplified circuit diagram of a method of reducing the transient current flowing in the buffer amplifier of the circuit of FIG. 14.

FIG. 14 shows an oscillator circuit 36, which could be of the form shown in FIG. 1 described above, and is connected to a buffer circuit composed of CMOS inverter 38. Due to the relatively long rise and fall times of the waveform of the output signal from such an oscillator circuit, the current drawn by inverter 38 is comparatively high. One method of reducing this current is as shown in FIG. 15, by inserting diodes 40 and 42 in seris with the source terminals of CMOS inverter 38. It will be apparent that, for a given conductance of the P-MOS and N-MOS transistors in inverter 38, the transient drain current will be reduced by this method.

Figure 16:
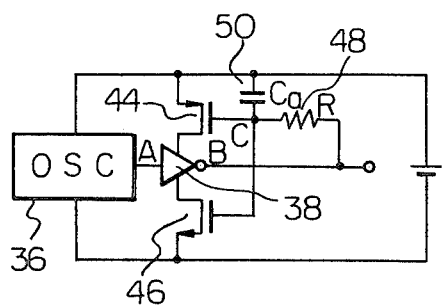
FIG. 16 is a circuit diagram of a fourth embodiment of the present invention, applied to a buffer amplifier.

A fourth embodiment of the present invention is shown in FIG. 16. In this embodiment, an amplitude-controlled inverter stage, having the circuit configuration shown in FIG. 8 and described previously, is applied as a buffer stage, to which the output of an oscillator circuit is input. The same advantages as were described above in relation to the first embodiment of the present invention are obtained by this embodiment. Thus, the current drawn is extremely low, while the output voltage amplitude remains almost constant in spite of variations in the amplitude of the output signal from the oscillator stage 36.

Figure 17:
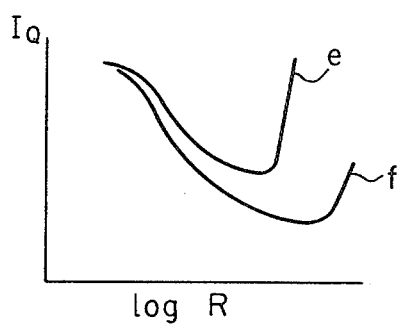
FIG. 17 is a graph showing the relationship between the average transient current flowing in the amplifying CMOS transistor of an oscillator circuit to which the method of FIGS. 4 or 5 is applied, when such a circuit is connected to the buffer circuit of the fourth embodiment of the present invention.

If the method of reducing the transient drain current of the amplifying CMOS inverter used in a quartz crystal oscillator by inserting series resistance which is shown in FIG. 4, is applied to the arrangement of the fourth embodiment, then the relation between the value resistance inserted and the average drain current drawn becomes as shown by curve f in FIG. 17. This shows that insertion of resistance in the oscillator amplifier CMOS inverter becomes a much more effective method of reducing current consumption if the present invention is applied to the buffer stage which is driven by the output of the oscillator.

Figure 18:
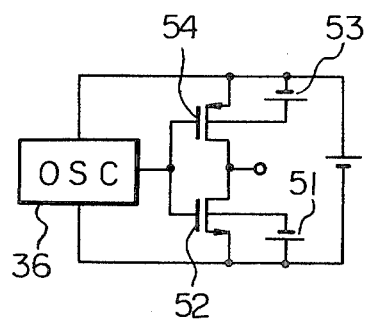
FIG. 18 is a circuit diagram of a fifth embodiment of the present invention, whereby a back bias is applied between the gates and substrates of a buffer amplifier CMOS transistor.

Referring now to FIG. 18, a fifth embodiment of the present invention as shown therein. In this case, to reduce the transient drain current drawn by a CMOS inverter composed of P-MOS transistor 54 and N-MOS transistor 52, to which the output of oscillator circuit 36 is applied, a back bias voltage is applied to the sources of these transistors 52 and 54, and to substrates of these transistors through back bias voltage applying means 51 and 53, respectively. This has the effect of increasing the absolute value of the threshold voltage of each transistor, thereby reducing the duration of the time during which the gate input voltage moves between the threshold voltages. Since this is the time during which a transient drain current is drawn (since both transistors of the CMOS inverter are in the conducting condition) it is apparent that this transient drain current will be reduced. This method has the advantage of causing relatively little reduction of the amplitude of the output signal from the inverter stage, as compared with the method of inserting resistance in series with the transistors of the CMOS inverter.

Figure 19:
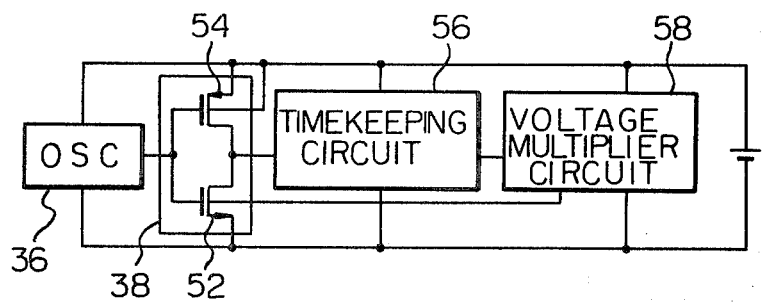
FIG. 19 is a circuit diagram of a practical method of realizing the embodiment of the present invention shown in FIG. 18.

The circuit diagram of FIG. 19 shows a practical method of applying the fifth embodiment of the present invention, described above, to an electronic timepiece. In this figure, the output signal from buffer stage CMOS inverter 38 drives timekeeping circuits 56. An output signal from circuit 56 drives a voltage multiplier circuit 58, which generates a voltage of suitable level for applying to N-MOS transistor 52, to provide a back bias voltage between the source and substrate of this transistor.

While the present invention has been shown and described with reference to particular embodiments, it should be noted that various other changes or modifications may be made without departing from the scope of the present invention.

What is claimed is:

1. An oscillator circuit having a power source and a signal source, comprising:
    a complementary pair of field effect transistors having gate electrodes connected to an output terminal of said signal source;
    at least one amplitude control field effect transistor having a source electrode connected to said power source and a drain electrode connected to a source electrode of said complementary pair of field effect transistors;

resistor having one terminal connected to drain electrodes of said complementary pair of field effect transistors and to an input terminal of said signal source, and having another terminal connected to a gate electrode of said amplitude control field effect transistor; and a capacitor having one terminal connected to said gate electrode of said amplitude control field effect transistor and to said another terminal of said resistor, and having another terminal connected to said power source.

2. An oscillator circuit having a power source and a signal source, comprising:
   a complementary pair of field effect transistors having gate electrodes connected to an output terminal of said signal source;
   at least one amplitude control field effect transistor having a source electrode connected to said power source and a drain electrode connected to a source electrode of said complementary pair of field effect transistors;
   a resistor having one terminal connected to drain electrodes of said complementary pair of field effect transistors and another terminal connected to an input terminal of said signal source and a gate electrode of said amplitude control field effect transistor; and
   a capacitor having one terminal connected to said gate electrode of said amplitude control field effect transistor and to said another terminal of said resistor, and having another terminal connected to said power source.

3. A buffer circuit having a power source, and an oscillator signal source, comprising:
   a complementary pair of field effect transistors having gate electrodes connected to an output of said oscillator signal source;
   at least one amplitude control field effect transistor having a source electrode connected to said power source and a drain electrode connected to a source electrode of said complementary pair of field effect transistors;
   a resistor having one terminal connected to a drain electrode of said complementary pair of field effect transistors, and having another terminal connected to a gate electrode of said amplitude control field effect transistor; and
   a capacitor having one terminal connected to a gate electrode of said amplitude control field effect transistor and to said another terminal of said resistor, and having another terminal connected to said power source.

4. An amplitude control inverter for an electronic device having a power source and a signal source, comprising:
   a complementary pair of field effect transistors having gate electrodes connected to said signal source and with the drain electrodes of said complementary pair of field effect transistors connected together;
   a resistor having a first terminal connected to the junction of said drain electrodes of the complementary pair of field effect transistors to receive an output signal generated therefrom;
   a capacitor having a first terminal connected to a second terminal of said resistor and having a second terminal connected to said power source, whereby said output signal from the complementary pair of field effect transistors is produced, delayed in phase, at the junction of said resistor and said capacitor; and
   at least one amplitude control field effect transistor connected in series between said complementary pair of field effect transistors and said power source, said amplitude control field effect transistor having a gate terminal connected to the junction of said resistor and capacitor to receive said phase-delayed output signal from the complementary pair of field effect transistors;
   said amplitude control field effect transistor being responsive to said phase-delayed output signal for controlling a duration of a current which flows in said complementary pair of field effect transistors as a result of a change in potential of a signal generated by said signal source.

5. An amplitude control inverter according to claim 4, wherein said at least one amplitude control field effect transistor has a source electrode connected to said power source and a drain electrode connected to a source electrode of a transistor of said complementary pair of field effect transistors.

6. An amplitude control inverter circuit for an electronic device having a power source and a signal source, comprising, in combination:
   a complementary pair of field effect transistors comprising a P-channel field effect transistor and an N-channel field effect transistor, with the gate electrodes of said complementary pair of field effect transistors being connected to said signal source and with the drain electrodes thereof being connected together;
   a P-channel amplitude control field effect transistor having a source electrode connected to said power source and a drain electrode connected to a source electrode of said P-channel field effect transistor of said complementary pair;
   an N-channel amplitude control field effect transistor having a source electrode connected to said power source and a drain electrode connected to a source electrode of said N-channel field effect transistor of said complementary pair;
   a resistor having a first terminal connected to the junction of said drain electrodes of said complementary pair of field effect transistors to receive an output signal generated therefrom; and
   a capacitor having a first terminal connected to a second terminal of said resistor and having a second terminal connected to said power source, whereby said output signal from said complementary pair of field effect transistors is produced, delayed in phase, at the junction of said resistor and said capacitor, with the junction of said resistor and capacitor being connected to gate electrodes of said P-channel and N-channel amplitude control field effect transistors;
   said P-channel and N-channel amplitude control field effect transistors being responsive to said delayed output signal from said complementary pair of field effect transistors for controlling a duration of a current which flows in said complementary pair of field effect transistors as a result of a change in potential of a signal generated by said signal source.

* * * * *